US011808696B2

(12) United States Patent
Matsuyama

(10) Patent No.: US 11,808,696 B2
(45) Date of Patent: Nov. 7, 2023

(54) SUBSTRATE PROCESSING APPARATUS AND SUBSTRATE PROCESSING METHOD TO SUPPRESS ALTERATION OF PROCESSING LIQUID

(71) Applicant: Tokyo Electron Limited, Tokyo (JP)

(72) Inventor: Noboru Matsuyama, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/749,530

(22) Filed: May 20, 2022

(65) Prior Publication Data

US 2022/0276155 A1 Sep. 1, 2022

Related U.S. Application Data

(63) Continuation of application No. 16/957,907, filed as application No. PCT/JP2018/046164 on Dec. 14, 2018, now Pat. No. 11,360,019.

(30) Foreign Application Priority Data

Dec. 28, 2017 (JP) ................................. 2017-253703

(51) Int. Cl.
*G01N 21/31* (2006.01)
*G01N 21/27* (2006.01)
(Continued)

(52) U.S. Cl.
CPC ........... *G01N 21/31* (2013.01); *G01N 21/251* (2013.01); *G01N 21/27* (2013.01); *G01N 21/85* (2013.01);
(Continued)

(58) Field of Classification Search
CPC ...... G01N 21/31; G01N 21/251; G01N 21/27; G01N 21/85; G01N 2021/8416;
(Continued)

(56) References Cited

U.S. PATENT DOCUMENTS

2006/0029388 A1* 2/2006 Terada ................ H01L 21/6715
396/611
2021/0080830 A1* 3/2021 Kunugimoto ..... H01L 21/67253

FOREIGN PATENT DOCUMENTS

JP 2016-225574 A 12/2016
TW 2013-23095 A 6/2013

OTHER PUBLICATIONS

International Search Report dated Feb. 26, 2019 for WO 2019/131226 A1 (4 pages).

* cited by examiner

*Primary Examiner* — Michael P LaPage
(74) *Attorney, Agent, or Firm* — Venjuris, P.C.

(57) ABSTRACT

A coating/developing device includes: a first laser unit that irradiates a coating liquid with laser light and acquires a state of the coating liquid based on a change in the laser light; and an irradiation propriety determination mechanism that determines whether the first laser unit irradiates the coating liquid with the laser light based on the coating liquid on a liquid bottle side of a position where the laser light is irradiated from the first laser unit in a flow path. The irradiation propriety determination mechanism includes: a second laser unit that acquires color information of the coating liquid; and a controller. The controller determines whether the color information of the coating liquid is predetermined color information that readily absorbs a wavelength of the light irradiated by the first laser unit and executes determining whether to irradiate the coating liquid with the laser light based on the determination result.

7 Claims, 10 Drawing Sheets

(51) Int. Cl.
  *G03F 7/20* (2006.01)
  *G01N 21/25* (2006.01)
  *G01N 21/85* (2006.01)
  *H01L 21/67* (2006.01)
  *G03F 7/16* (2006.01)

(52) U.S. Cl.
  CPC ............ G03F 7/20 (2013.01); H01L 21/6715 (2013.01); H01L 21/67253 (2013.01); *G03F 7/16* (2013.01)

(58) Field of Classification Search
  CPC ..... G03F 7/20; G03F 7/16; G03F 7/30; G03F 7/162; G03F 7/70908; H01L 21/6715; H01L 21/67253; H01L 21/027
  See application file for complete search history.

SUBSTRATE PROCESSING APPARATUS AND SUBSTRATE PROCESSING METHOD TO SUPPRESS ALTERATION OF PROCESSING LIQUID

CROSS REFERENCE TO RELATED APPLICATIONS

This application is a continuation application of U.S. application Ser. No. 16/957,907, filed on Jun. 25, 2020, which is a national phase of PCT application No. PCT/JP2018/046164, filed on Dec. 14, 2018, which claims priority from Japanese Patent Application No. 2017-253703, filed on Dec. 28, 2017, all of which are incorporated herein by reference.

TECHNICAL FIELD

The present disclosure relates to a substrate processing apparatus, a substrate processing method, and a computer-readable recording medium.

BACKGROUND

Patent Document 1 describes, as a configuration for detecting minute foreign matters contained in a processing liquid supplied to a substrate (particles, bubbles, etc.), that the processing liquid flowing through a flow path is irradiated with laser light, a signal output from a light receiving element is acquired according to the irradiated laser light, and the number, size, and type of foreign matters are determined based on the signal.

PRIOR ART DOCUMENT

Patent Document

Patent Document 1: Japanese Patent Laid-Open Publication No. 2016-225574

SUMMARY OF THE INVENTION

Problems to be Solved

Here, depending on a combination of the wavelength band of the light with which the processing liquid is irradiated and the color of the processing liquid, there is a possibility that the processing liquid may be altered (chemical liquid modified) due to the absorption of light.

Therefore, the present disclosure describes a substrate processing apparatus, a substrate processing method, and a computer-readable recording medium that may appropriately prevent the processing liquid from being altered in a configuration in which the processing liquid is irradiated with light.

Means to Solve the Problems

A substrate processing apparatus according to an aspect of the present disclosure includes: an optical measurement mechanism that irradiates a processing liquid of a substrate flowing through a flow path with light and acquires a state of the processing liquid based on a change in the light; and an irradiation propriety determination mechanism that determines whether to irradiate the processing liquid with the light by the optical measurement mechanism based on the processing liquid on a supply source side of the processing liquid rather than a position where the processing liquid is irradiated with the light by the optical measurement mechanism in the flow path. The irradiation propriety determination mechanism includes: a color information acquisition mechanism that acquires color information of the processing liquid; and a controller. The controller is configured to determine whether the color information of the processing liquid is predetermined color information that readily absorbs a wavelength of the light irradiated by the optical measurement mechanism, and determine whether to irradiate the processing liquid with the light based on a determination result and output information indicating whether to irradiate.

In such a substrate processing apparatus, it is determined whether the color information of the processing liquid is predetermined color information that readily absorbs the wavelength of the irradiated light, based on the processing liquid on an upstream side of the position where the light is irradiated to the processing liquid by the optical measurement mechanism, and whether to irradiate the processing liquid with light is determined based on the determination result. Depending on a combination of the color of the processing liquid and the wavelength band of the irradiated light, the processing liquid may be altered due to the absorption of light. In this regard, it is possible to determine whether the processing liquid is altered by the irradiated light by determining whether the color information of the processing liquid is predetermined color information that readily absorbs the wavelength of light in the stage before irradiating the processing liquid with light. Then, whether the irradiation of light to the processing liquid is possible is determined based on the determination result and information indicating whether the irradiation is possible is output, so that, for example, the processing liquid flowing through the flow path may be altered by light from the optical measurement mechanism. In such a case, it becomes possible to take measures such as stopping the irradiation of the light from the optical measurement mechanism, which may cause the processing liquid to be altered. As described above, according to the present disclosure, in the configuration of irradiating the processing liquid with light, even when a processing liquid different from the ordinary one flows due to a certain mistake, it is possible to appropriately prevent the processing liquid from being altered.

The color information acquisition mechanism may have a colorimeter or an imaging device. Since the color information acquisition mechanism has the colorimeter or the imaging device, the color information of the processing liquid may be properly grasped.

The color information acquisition mechanism includes an irradiation unit that irradiates the processing liquid with discrimination light having a wavelength that is similar to the wavelength of the light irradiated from the optical measurement mechanism to the processing liquid. The controller may determine that the color information of the processing liquid is predetermined color information that readily absorbs the wavelength of the light irradiated by the optical measurement mechanism when the discrimination light irradiated to the processing liquid by the irradiation unit is absorbed in the processing liquid for a certain amount or more. When the discrimination light is absorbed in the processing liquid for a certain amount or more, it is considered that the processing liquid also readily absorbs the light, which has a wavelength similar to that of the discrimination light and is irradiated to the processing liquid from the optical measurement mechanism. Therefore, when the discrimination light is absorbed in the processing liquid for a certain amount or more, it is possible to readily and accurately determine whether the irradiation is possible by determining that the color information of the processing liquid is predetermined color information that readily absorbs the wavelength of the light irradiated by the optical measurement mechanism and that the light irradiation to the processing liquid is impossible.

The irradiation unit may irradiate, as the discrimination light, light having a wavelength longer than that of the light irradiated from the optical measurement mechanism to the processing liquid. By making the discrimination light long-wavelength light, that is, light having low energy, it is possible to suppress the alteration of the processing liquid in the step of irradiating the discrimination light (determination step).

The color information acquisition mechanism may include an irradiation unit that irradiates the processing liquid with discrimination light having an irradiation intensity lower than that of the light irradiated from the optical measurement mechanism to the processing liquid. As a result, it is possible to prevent the processing liquid from being altered in the step of irradiating the discrimination light (determination step).

The irradiation unit may irradiate the processing liquid with a plurality of patterns of light having different wavelengths. This makes it possible to more finely specify the wavelength band in which the processing liquid is likely to absorb.

When it is determined that the processing liquid may not be irradiated with light, the controller may output, as information indicating whether the irradiation is possible, a warning indicating that the color of the processing liquid is abnormal, and information specifying the substrate that is being processed. Accordingly, it is possible to appropriately execute the process of preventing the alteration of the processing liquid based on the information indicating whether the irradiation is possible.

When it is determined that the irradiation of light to the processing liquid is impossible, the controller may be configured to further execute at least one of a shutoff control of shutting off an output of the light by the optical measurement mechanism, a load stop control of stopping a loading of a new substrate, a liquid feed stop control of stopping a liquid feeding of the processing liquid to the flow path, and a drainage control of discarding the processing liquid flowing through the flow path. Thus, it is possible to appropriately prevent alteration of the processing liquid and influence of alteration of the processing liquid from affecting the substrate. That is, since the processing liquid is not irradiated with the shutoff control, the alteration of the processing liquid may be prevented. Further, the load stop control is performed, so that the altered processing liquid may be prevented from being applied to the substrate. In addition, it is possible to prevent the liquid feeding of the processing liquid that may be altered by the irradiation of light by performing the liquid feed stop control. Further, it is possible to appropriately discard the processing liquid that may be altered by performing the drainage control.

A substrate processing method according to an aspect of the present disclosure includes: acquiring color information of a processing liquid of a substrate flowing through a flow path; determining whether the color information of the processing liquid is predetermined color information that readily absorbs a wavelength of a light irradiated to the processing liquid from an optical measurement mechanism; and only when it is determined that the color information is not predetermined color information, irradiating the processing liquid with light from the optical measurement mechanism and acquiring a state of the processing liquid based on a change in the light.

Acquiring the color information of the processing liquid is performed by irradiating the processing liquid with discrimination light having a wavelength similar to a wavelength of the light irradiated to the processing liquid from the optical measurement mechanism, and determining whether the color information is predetermined color information is performed by determining that the color information of the processing liquid is the predetermined color information when the discrimination light is absorbed in the processing liquid for a certain amount or more.

A recording medium according to an aspect of the present disclosure is a computer-readable recording medium in which a program for causing a substrate processing mechanism to execute the substrate processing method described above is recorded.

Effect of the Invention

According to the substrate processing apparatus, the substrate processing method, and the computer-readable recording medium according to the present disclosure, it is possible to appropriately prevent the processing liquid from being altered in the configuration in which the processing liquid is irradiated with light.

DETAILED DESCRIPTION TO EXECUTE THE INVENTION

Embodiments of the present disclosure will be described with reference to the drawings, but the following embodiments are examples for explaining the present disclosure and are not intended to limit the present disclosure to the following contents. In the following description, the same elements or elements having the same function are denoted by the same reference symbols, and redundant descriptions thereof are omitted.

[Configuration of Substrate Processing System]

The substrate processing system 1 includes a coating/developing device 2 and an exposure device 3. The exposure device 3 performs an exposure process on a resist film. Specifically, the exposure target portion of the resist film (photosensitive coating) is irradiated with energy rays by a method such as immersion exposure. Examples of the energy rays include ArF excimer laser, KrF excimer laser, g-ray, i-ray, and extreme ultraviolet (EUV).

The coating/developing device 2 (substrate processing apparatus) performs a process of forming a resist film on the surface of a wafer W (substrate) before the exposure process by the exposure device 3, and a developing process of the resist film after the exposure process. In the present embodiment, the wafer W has a disk shape, but a wafer having a circular shape partially cut out or having a shape other than a circular shape such as a polygonal shape may be used. The wafer W may be, for example, a semiconductor substrate, a glass substrate, a mask substrate, a flat panel display (FPD) substrate, or other various substrates.

Figure 1:
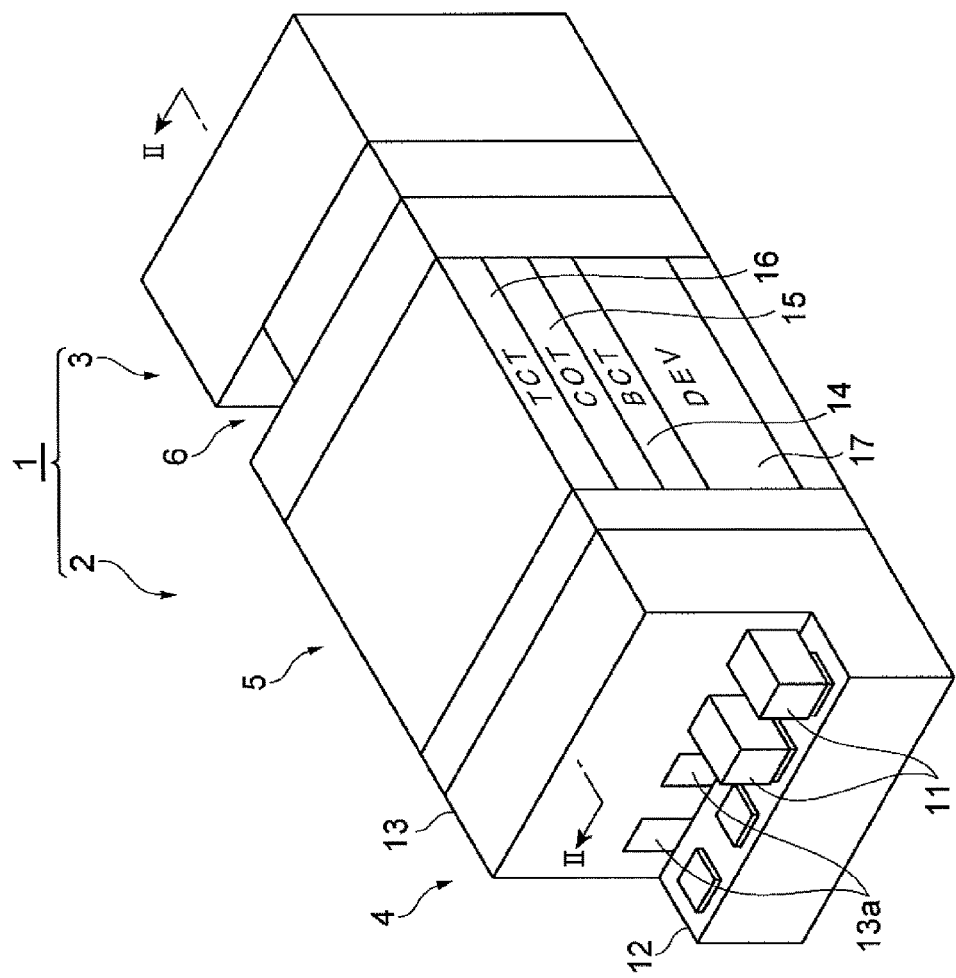
FIG. 1 is a perspective view illustrating a substrate processing system.
Figure 2:
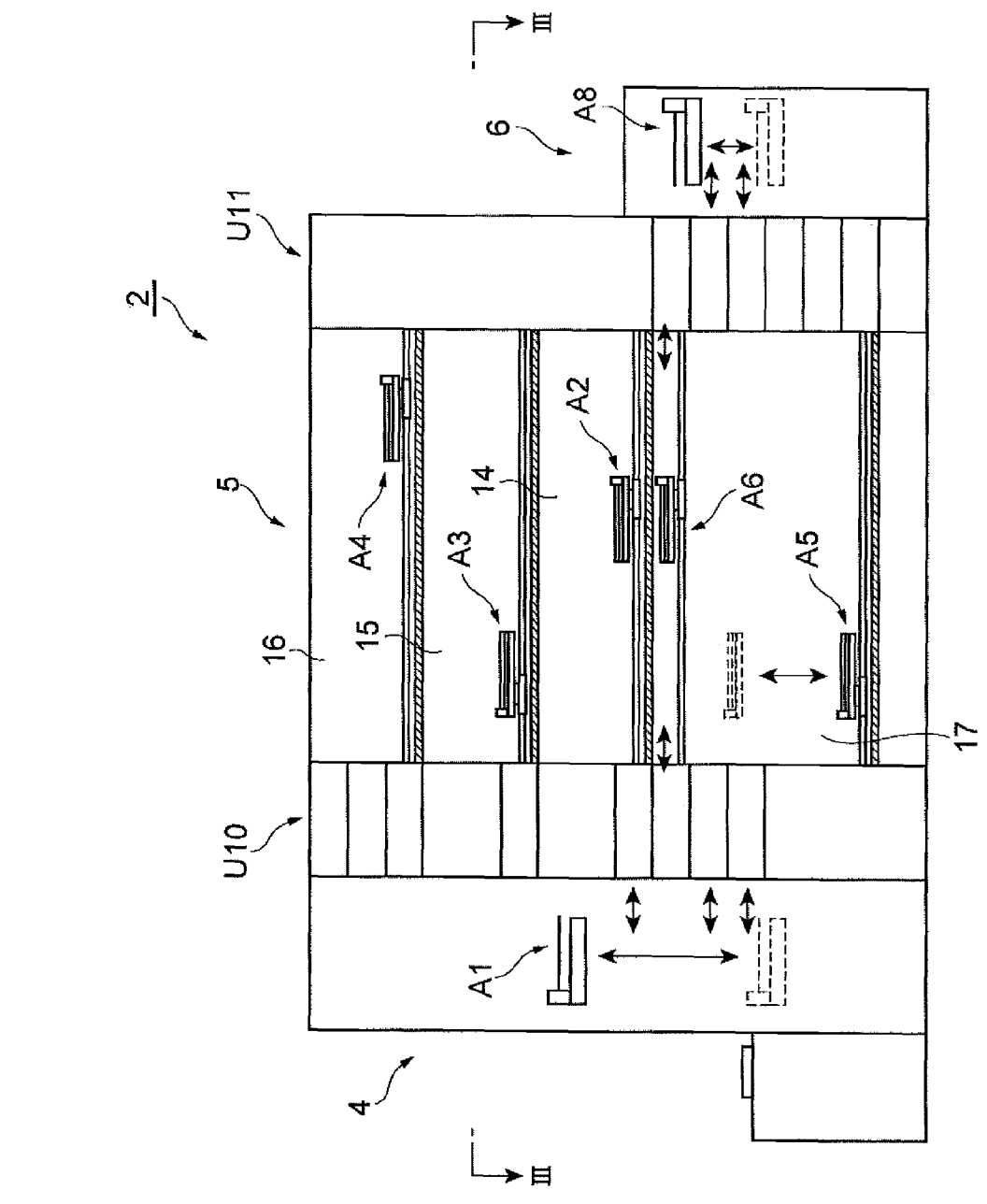
FIG. 2 is a cross-sectional view taken along line II-II in FIG. 1.
Figure 3:
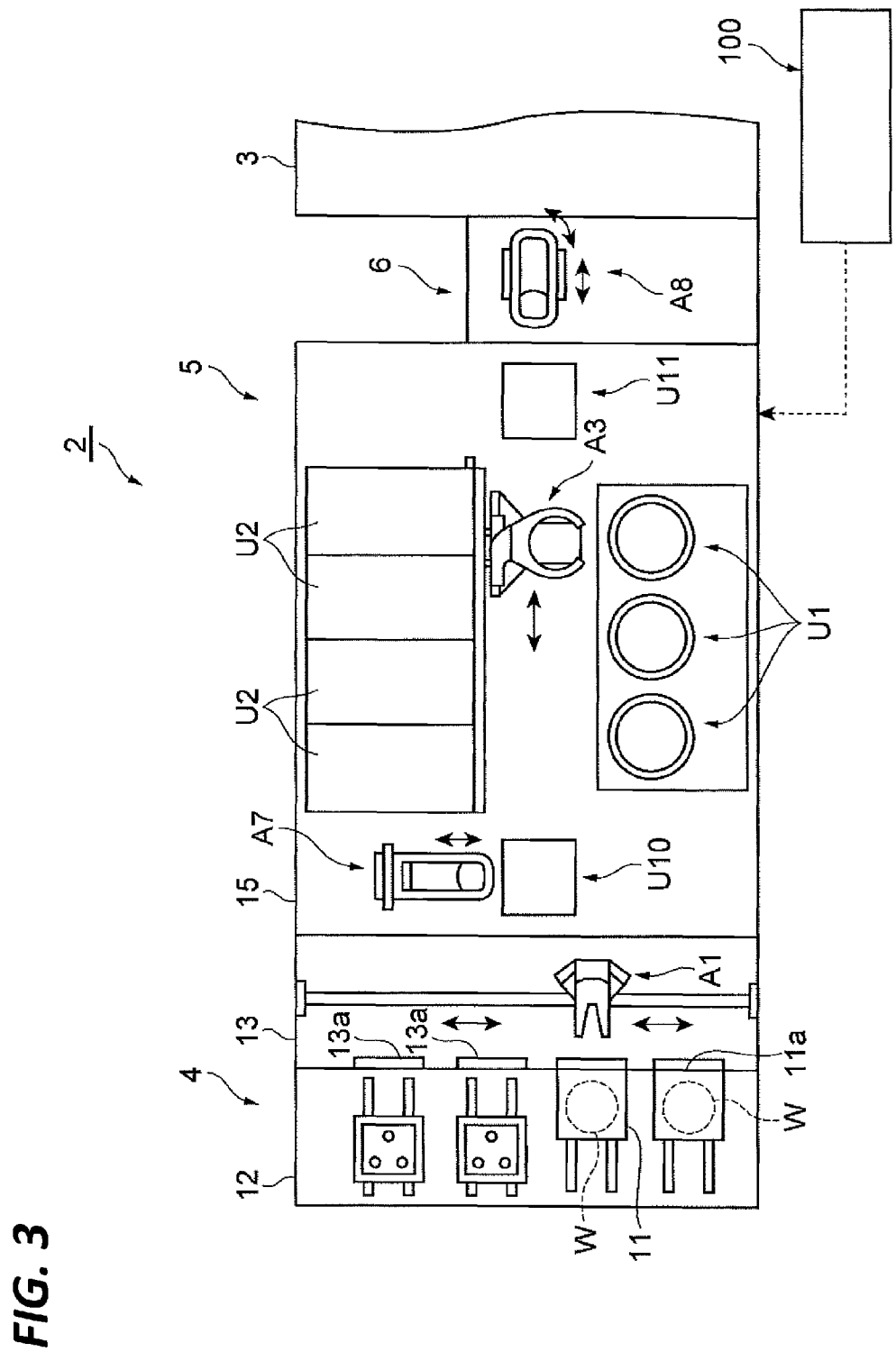
FIG. 3 is a cross-sectional view taken along line of FIG. 2.

As illustrated in FIGS. 1 to 3, the coating/developing device 2 includes a carrier block 4, a processing block 5, an interface block 6, and a controller 100. The carrier block 4, the processing block 5, and the interface block 6 are arranged in the horizontal direction.

The carrier block 4 includes a carrier station 12 and a loading/unloading section 13. The loading/unloading section 13 is interposed between the carrier station 12 and the processing block 5. The carrier station 12 supports a plurality of carriers 11. Each of the carriers 11 accommodates, for example, a plurality of circular wafers W in a sealed state, and has an opening/closing door (not illustrated) for loading and unloading the wafers W on a side surface 11a. Each of the carriers 11 is detachably installed on the carrier station 12 so that the side surface 11a faces the loading/unloading section 13 side. The loading/unloading section 13 includes a plurality of opening/closing doors 13a respectively corresponding to the plurality of carriers 11 on the carrier station 12. By simultaneously opening the opening/closing door of the side surface 11a and the opening/closing door 13a, the inside of the carrier 11 and the inside of the loading/unloading section 13 communicate with each other. The loading/unloading section 13 has a built-in transfer arm A1. The transfer arm A1 takes out the wafer W from the carrier 11 to transfer the wafer W to the processing block 5, and receives the wafer W from the processing block 5 and returns the wafer W into the carrier 11.

The processing block 5 includes a BCT module (lower layer film forming module) 14, a COT module (resist film forming module) 15, a TCT module (upper layer film forming module) 16, and a DEV module (developing processing module) 17. These modules are arranged in order of the DEV module 17, the BCT module 14, the COT module 15, and the TCT module 16 from the floor side.

The BCT module 14 is configured to form a lower layer film on the surface of the wafer W. The BCT module 14 has a plurality of coating units (not illustrated), a plurality of heat treatment units (not illustrated), and a transfer arm A2 that transfers the wafer W to these units. The coating unit is configured to coat the surface of the wafer W with the coating liquid for forming the lower layer film. The heat treatment unit is configured to heat the wafer W by, for example, a hot plate, and cool the heated wafer W by, for example, a cooling plate to perform a heat treatment. A specific example of the heat treatment performed in the BCT module 14 is a heat treatment for curing the coating liquid.

The COT module 15 is configured to form a thermosetting and photosensitive resist film on the lower layer film. The COT module 15 has a plurality of coating units U1, a plurality of heat treatment units U2, and a transfer arm A3 that transfers the wafer W to these units. The coating unit U1 is configured to coat a coating liquid (resist agent) for forming a resist film on the lower layer film. The heat treatment unit U2 is configured to heat the wafer W by, for example, a hot plate, and cool the heated wafer W by, for example, a cooling plate to perform a heat treatment. A specific example of the heat treatment performed in the COT module 15 is a heat treatment (PAB: Pre Applied Bake) for curing the coating liquid.

The TCT module 16 is configured to form an upper layer film on the resist film. The TCT module 16 has a plurality of coating units (not illustrated), a plurality of heat treatment units (not illustrated), and a transfer arm A4 that transfers the wafer W to these units. The coating unit is configured to coat the surface of the wafer W with the coating liquid for forming the upper layer film. The heat treatment unit is configured to heat the wafer W by, for example, a hot plate, and cool the heated wafer W by, for example, a cooling plate to perform a heat treatment. A specific example of the heat treatment performed in the TCT module 16 is a heat treatment for curing the coating liquid.

The DEV module 17 is configured to develop the exposed resist film. The DEV module 17 has a plurality of developing units (not illustrated), a plurality of heat treatment units (not illustrated), a transfer arm A5 that transfers the wafer W to these units, and a direct transfer arm A6 that transfers the wafer W without going through these units. The developing unit is configured to partially remove the resist film and form a resist pattern. The heat treatment unit is configured to heat the wafer W by, for example, a hot plate, and cool the heated wafer W by, for example, a cooling plate to perform a heat treatment. Specific examples of the heat treatment performed in the DEV module 17 include a heat treatment before the development treatment (PEB: Post Exposure Bake) and a heat treatment after the development treatment (PB: Post Bake).

A shelf unit U10 is provided on the carrier block 4 side in the processing block 5. The shelf unit U10 is provided to extend from the floor surface to the TCT module 16, and is divided into a plurality of cells arranged in the vertical direction. An elevating arm A7 is provided near the shelf unit U10. The elevating arm A7 elevates and lowers the wafer W between the cells of the shelf unit U10.

A shelf unit U11 is provided on the interface block 6 side in the processing block 5. The shelf unit U11 is provided to extend from the floor surface to the upper portion of the DEV module 17, and is divided into a plurality of cells arranged in the vertical direction.

The interface block 6 has a transfer arm A8 built therein and is connected to the exposure device 3. The transfer arm A8 is configured to take out the wafer W from the shelf unit U11 to transfer the wafer W to the exposure device 3, receive the wafer W from the exposure device 3, and return the wafer W to the shelf unit U11.

The controller 100 is composed of one or a plurality of control computers and controls the coating/developing device 2. The controller 100 includes a display unit that displays a setting screen of control conditions (not illustrated), an input unit that inputs control conditions (not illustrated), and a reader that reads a program from a computer-readable recording medium (not illustrated). The recording medium records a program for causing the coating/developing device 2 to execute a process. This program is read by the reader of the controller 100. The recording medium may be, for example, a semiconductor memory, an optical recording disk, a magnetic recording disk, or a magneto-optical recording disk. The controller 100 controls the coating/developing device 2 in accordance with the control conditions input to the input unit and the program read by the reader.

[Configuration of Coating Unit]

Figure 4:
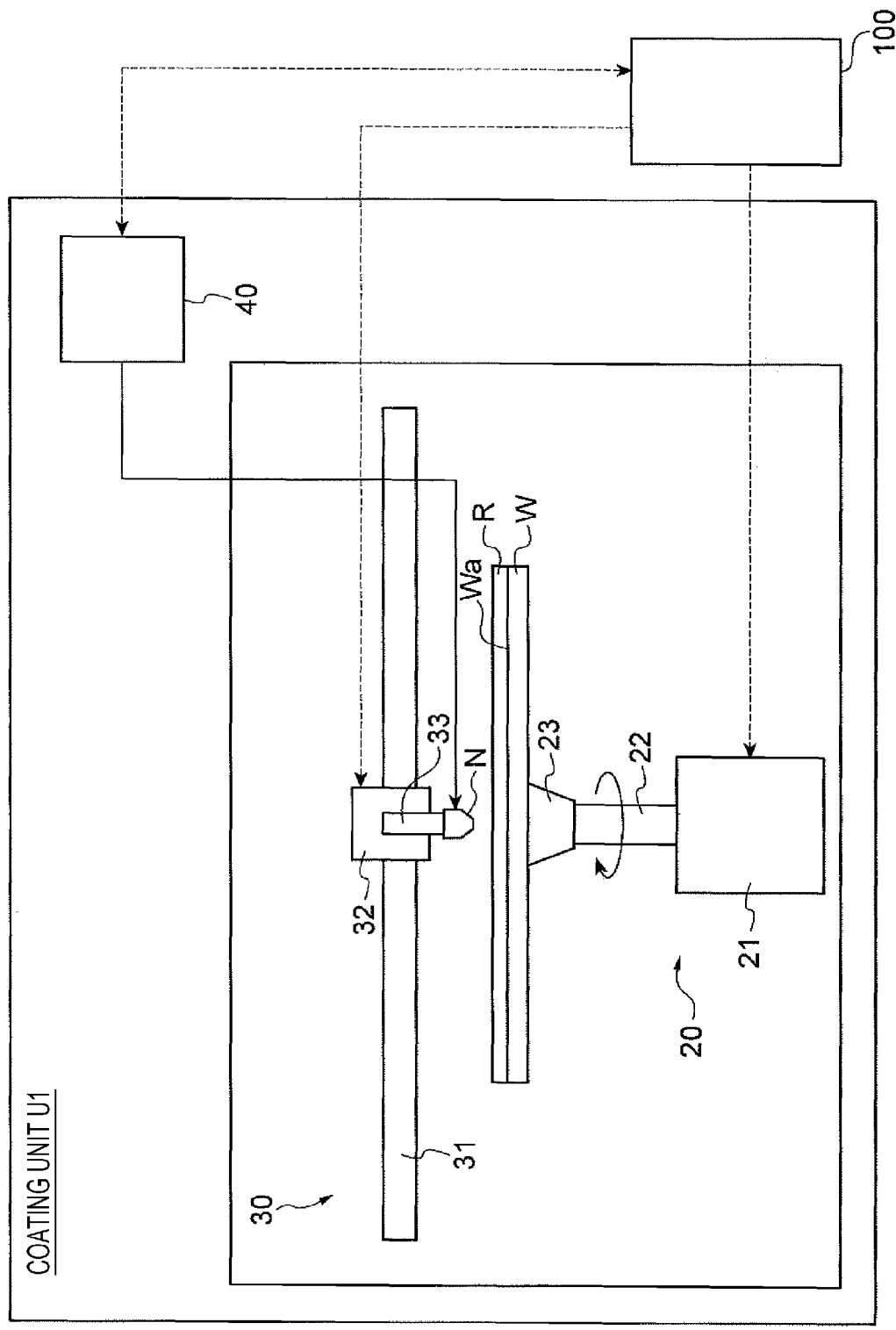
FIG. 4 is a schematic view illustrating a coating unit.

Subsequently, the coating unit U1 will be described in more detail with reference to FIG. 4. As illustrated in FIG. 4, the coating unit U1 includes a rotation holder 20, a drive unit 30, and a liquid supply system 40.

The rotation holder 20 has a rotation unit 21 and a holder 23. The rotation unit 21 has a shaft 22 protruding upward. The rotation unit 21 rotates the shaft 22 using, for example, an electric motor as a power source. The holder 23 is provided at the tip portion of the shaft 22. The wafer W is horizontally arranged on the holder 23. The holder 23 holds the wafer W substantially horizontally, for example, by suction. That is, the rotation holder 20 rotates the wafer W around an axis that is perpendicular to the surface of the wafer W (rotation axis) while the posture of the wafer W is substantially horizontal. In the present embodiment, the rotation axis passes through the center of the wafer W having a circular shape, and thus is also the center axis. In the present embodiment, as illustrated in FIG. 4, the rotation holder 20 rotates the wafer W clockwise when viewed from above.

The drive unit 30 is configured to drive a nozzle N. The drive unit 30 includes a guide rail 31, a slide block 32, and an arm 33. The guide rail 31 extends in the horizontal direction above the rotation holder 20 (wafer W). The slide block 32 is connected to the guide rail 31 to be movable in the horizontal direction along the guide rail 31. The arm 33 connects the slide block 32 and the nozzle N. The nozzle N is arranged at the lower end of the arm 33. The drive unit 30 moves the slide block 32 by using, for example, an electric motor as a power source, and moves the nozzle N accordingly. In a plan view, the nozzle N moves along a radial direction of the wafer W on a straight line orthogonal to the rotation axis of the wafer W.

The liquid supply system 40 receives the control signal from the controller 100 and discharges the coating liquid (processing liquid) from the nozzle N onto the front surface Wa of the wafer W. The nozzle N opens downward toward the front surface Wa of the wafer W. The coating liquid is a liquid used to form a coating film R (see, e.g., FIG. 4) on the front surface Wa of the wafer W. Examples of the coating liquid include a resist liquid for forming a resist pattern and a liquid for forming an anti-reflection film (e.g., a lower anti-reflection coating (BARC) film, a silicon-containing anti-reflection coating (SiARC) film). When the coating liquid discharged onto the front surface Wa of the wafer W dries, the coating film R is formed on the front surface Wa of the wafer W, as illustrated in FIG. 4. Details of the liquid supply system 40 will be described later.

[Detailed Configuration of Liquid Supply System and Function of Controller]

The detailed configuration of the liquid supply system 40 and the function of the controller 100 that controls the liquid supply system 40 will be described with reference to FIG. 5.

The liquid supply system 40 includes a liquid bottle B, a liquid tank LE, a pump device P1, a filter device F1, pipes D1 to D6 (flow paths), a valve V, three-way valves Vt1 to Vt3, and a first laser unit 50 (optical measurement mechanism), a second laser unit 60 (color information acquisition mechanism), and cuvettes 150 and 160.

The upstream end of the pipe D1 is connected to an $N_2$ gas source. The downstream end of the pipe D1 is connected to an upper lid portion of the liquid bottle B to be located near an upper lid of the liquid bottle B. The liquid bottle B functions as a supply source of the coating liquid.

The upstream end of the pipe D2 is connected to the upper lid portion of the liquid bottle B to be located near a lower bottom of the liquid bottle B. The downstream end of the pipe D2 is connected to an upper lid portion of the liquid tank LE to be located near an upper lid of the liquid tank LE. The cuvette 160 is provided on the pipe D2. The liquid tank LE functions as a storage that temporarily stores the coating liquid discharged from the liquid bottle B.

The upstream end of the pipe D3 (a form of liquid feed line) is connected to a lower bottom portion of the liquid tank LE. The downstream end of the pipe D3 is connected to the nozzle N. A filter device F1, a three-way valve Vt1, a pump device P1, a three-way valve Vt2, a cuvette 150, a valve V, and a three-way valve Vt3 are provided on the pipe D3 in this order from the upstream side.

The filter device F1 removes foreign matters such as particles contained in the coating liquid. The pump device P1 sucks the coating liquid in the liquid tank LE and sends the coating liquid toward the nozzle N. The valve V is an air-operated valve that opens and closes (on/off) a plate by using air. The valve V discharges the coating liquid from the nozzle N when the plate is opened, and stops the discharge of the coating liquid from the nozzle N when the plate is closed. The valve V may have a function of controlling the flow rate of the coating liquid discharged from the nozzle N to a predetermined size. The valve V may have a function (suck back function) of sucking the coating liquid in the nozzle N so that the coating liquid does not stay in the nozzle N when the discharge of the coating liquid from the nozzle N is stopped.

The pipe D3 has portions D3a to D3d. The portion D3a extends between the liquid tank LE and the filter device F1. The portion D3b extends between the three-way valve Vt1 and the pump device P1. The portion D3c extends between the three-way valve Vt2 and the valve V. The portion D3d extends between the three-way valve Vt3 and the valve V.

The three-way valve Vt1 is provided on an outlet side (downstream side) of the filter device F1. The three-way valve Vt1 is operated between a state in which the liquid is caused to flow between the filter device F1 and the portion D3b while blocking the flow of the liquid among the filter device F1, the portion D3b, and the pipe D4, and a state in which the liquid is caused to flow between the filter device F1 and the pipe D4 while blocking the flow of the liquid among the portion D3b, the filer device F1, and the pipe D4.

The three-way valve Vt2 is provided on an outlet side (downstream side) of the pump device P1. The three-way valve Vt2 is operated between a state in which the liquid is caused to flow between the pump device P1 and the portion D3c while blocking the flow of the liquid among the pump device P1, the portion D3c, and the pipe D5, and a state in which the liquid is caused to flow between the pump device P1 and the pipe D5 while blocking the flow of the liquid among the portion D3c, the pump device P1, and the pipe D5.

The three-way valve Vt3 is provided on the outlet side (downstream side) of the valve V. The three-way valve Vt3 is operated between a state in which the liquid is caused to flow between the valve V and the portion D3d while blocking the flow of the liquid among the valve V, the portion D3d, and the pipe D6, and a state in which the liquid is caused to flow between the valve V and the pipe D6 while blocking the flow of the liquid among the portion D3d, the valve V, and the pipe D6.

The upstream end of the pipe D4 is connected to the three-way valve Vt1. The upstream end of the pipe D5 is connected to the three-way valve Vt2. The upstream end of the pipe D6 is connected to the three-way valve Vt3. The liquid flowing through the pipes D4 to D6 is discharged outside the system through the pipes D4 to D6, respectively (outside the system).

The cuvette 150 is provided in the portion D3c, is a flow path of the coating liquid flowing through the portion D3c, and transmits the laser light from the first laser unit 50 (to be described later). The cuvette 160 is provided in the pipe D2, is a flow path of the coating liquid flowing through the pipe D2, and transmits the laser light from the second laser unit 60 (to be described later). The cuvettes 150 and 160 are made of, for example, transparent quartz so that the laser light may be transmitted.

Figure 6:
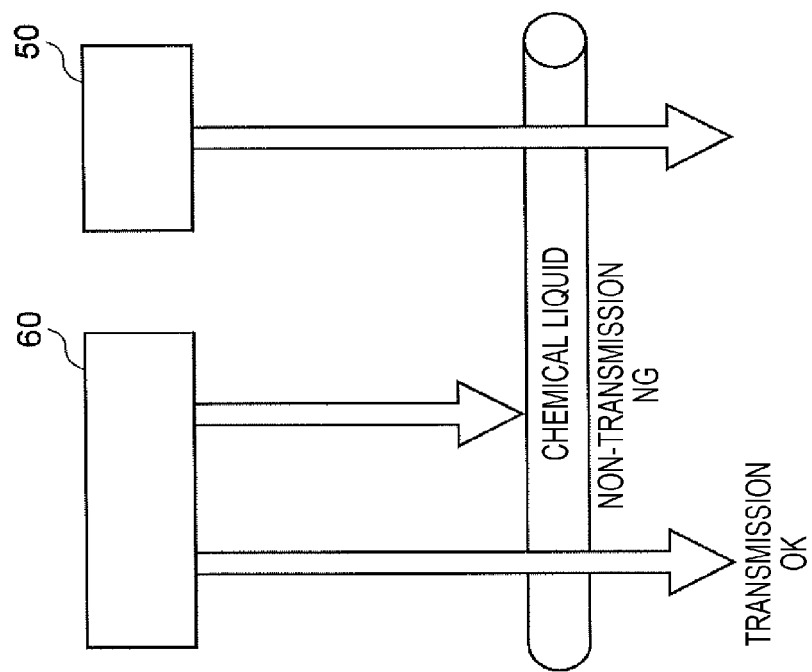
FIG. 6 is a view schematically illustrating a configuration for preventing alteration of a coating liquid according to the present embodiment.

As illustrated in FIG. 6, the liquid supply system 40 irradiates the coating liquid flowing through the pipe (specifically, the portion D3c) with laser light from the first laser unit 50. In the liquid supply system 40, the state of foreign matters (particles, bubbles, etc.) contained in the coating liquid is estimated from the intensity of the laser light that has transmitted the coating liquid. The state of the foreign matters refers to information indicating, for example, the particle diameter of the foreign matter, the number of the foreign matter, and the type of the foreign matter. For example, when the intensity of the acquired laser light is low, it is estimated that the particle diameter of the foreign matter is large or the number of the foreign matter is large.

Here, depending on the combination of the color of the coating liquid and the wavelength band of the laser light, the coating liquid may absorb the laser light, and thus the coating liquid may be altered (changes involving light emission, heat generation, chemical change, etc.). This may be avoided by grasping the color information of the coating liquid before the coating liquid is irradiated with laser light from the first laser unit 50 (details will be described later). As a configuration for grasping the color information of the coating liquid, as illustrated in FIG. 6, the liquid supply system 40 employs a configuration in which the second laser unit 60 irradiates the coating liquid with laser light upstream of the position where the first laser unit 50 irradiates the coating liquid with laser light. The laser light irradiated from the second laser unit 60 has a wavelength similar to that of the laser light irradiated from the first laser unit 50. Therefore, when the degree of absorption of the laser light irradiated from the second laser unit 60 to the coating liquid is high (e.g., the coating liquid does not transmit the laser light), it may be estimated that the coating liquid is likely to absorb the laser light irradiated from the first laser unit 50 (the laser light irradiated from the first laser unit 50 is likely to cause alteration). Meanwhile, when the degree of absorption of the laser light irradiated from the second laser unit 60 to the coating liquid is low (e.g., the coating liquid transmits the laser light), it may be estimated that the coating liquid is unlikely to absorb the laser light irradiated from the first laser unit 50 (the laser light irradiated from the first laser unit 50 is unlikely to cause alteration). Hereinafter, the details of the function of the controller 100 that controls the first laser unit 50, the second laser unit 60, and the liquid supply system 40 will be described.

Referring back to FIG. 5, the first laser unit 50 irradiates the coating liquid flowing through the portion D3c of the pipe D3 with laser light, and acquires the state of the coating liquid based on the change in the light. As illustrated in FIG. 5, the first laser unit 50 irradiates the coating liquid through the cuvette 150 by irradiating the cuvette 150 that transmits the laser light with the laser light. The wavelength of the laser light irradiated from the first laser unit 50 is, for example, 532 nanometers. The irradiation intensity of the laser light irradiated from the first laser unit 50 is, for example, about 800 W. The wavelength and energy of the laser light irradiated from the first laser unit 50 are examples, and the present disclosure is not limited thereto.

A more specific configuration of the first laser unit 50 will be described with reference to FIG. 7. The first laser unit 50 includes a light source 51, a shutter 52, a fiber 53, a collimator 54, an objective lens 55, a light receiving lens 56, and a light receiving element 57. The light source 51 is a light supply that irradiates laser light. The laser light irradiated from the light source 51 is guided to the fiber 53. The collimator 54 is provided at the lower end of the fiber 53. The shutter 52 moves between a shielding position that shields an optical path between the upstream side and the downstream side of the fiber 53 (a position indicated by a chain double-dashed line in FIG. 7) and an open position that retracts from the optical path (a position indicated by a solid line in FIG. 7), and opens and closes the optical path. In the first laser unit 50, the actuator moves the shutter 52 according to the control of the controller 100, so that the optical path is opened or closed. The parallel light emitted from the collimator 54 is applied to the cuvette 150 (i.e., the coating liquid flowing in the cuvette 150) via the objective lens 55 which is a condenser lens. The light irradiated to the cuvette 150 is guided to the light receiving element 57 via the light receiving lens 56. The light receiving element 57 outputs an electric signal corresponding to the received light to the controller 100. According to such a configuration, since the electric signal output from the light receiving element 57 changes according to the state of foreign matters in the coating liquid flowing through the cuvette 150, the state of the coating liquid (how much foreign matters are contained, etc.) may be grasped according to the electric signal.

Referring back to FIG. 5, the second laser unit 60 acquires the color information of the coating liquid by irradiating the coating liquid flowing through the pipe D2 with laser light (discrimination light). The color information of the coating liquid is, for example, information indicating whether the coating liquid has a color that readily absorbs the laser light irradiated from the second laser unit 60. As illustrated in FIG. 5, the second laser unit 60 irradiates the coating liquid through the cuvette 160 by irradiating the cuvette 160 that transmits the laser light with the laser light. The second laser unit 60 has a light source 61 (irradiation unit). The light source 61 is a light supply that irradiates laser light. The light source 61 irradiates the coating liquid with laser light having a wavelength similar to the wavelength of the laser light irradiated from the first laser unit 50 to the coating liquid, and more specifically, irradiates light having a wavelength longer than the wavelength of the laser light irradiated from the first laser unit 50 to the coating liquid. The light source 61 may irradiate laser light of about 600 to 800 nm when the wavelength of the laser light irradiated from the first laser unit 50 is 532 nm. Further, the light source 61 may irradiate the coating liquid with laser light whose irradiation intensity is lower than that of the laser light with which the first laser unit 50 irradiates the coating liquid. The light source 61 may irradiate laser light with an irradiation intensity of about 100 mW when the irradiation intensity of the laser light irradiated from the first laser unit 50 is, for example, 1 W.

Figure 7:
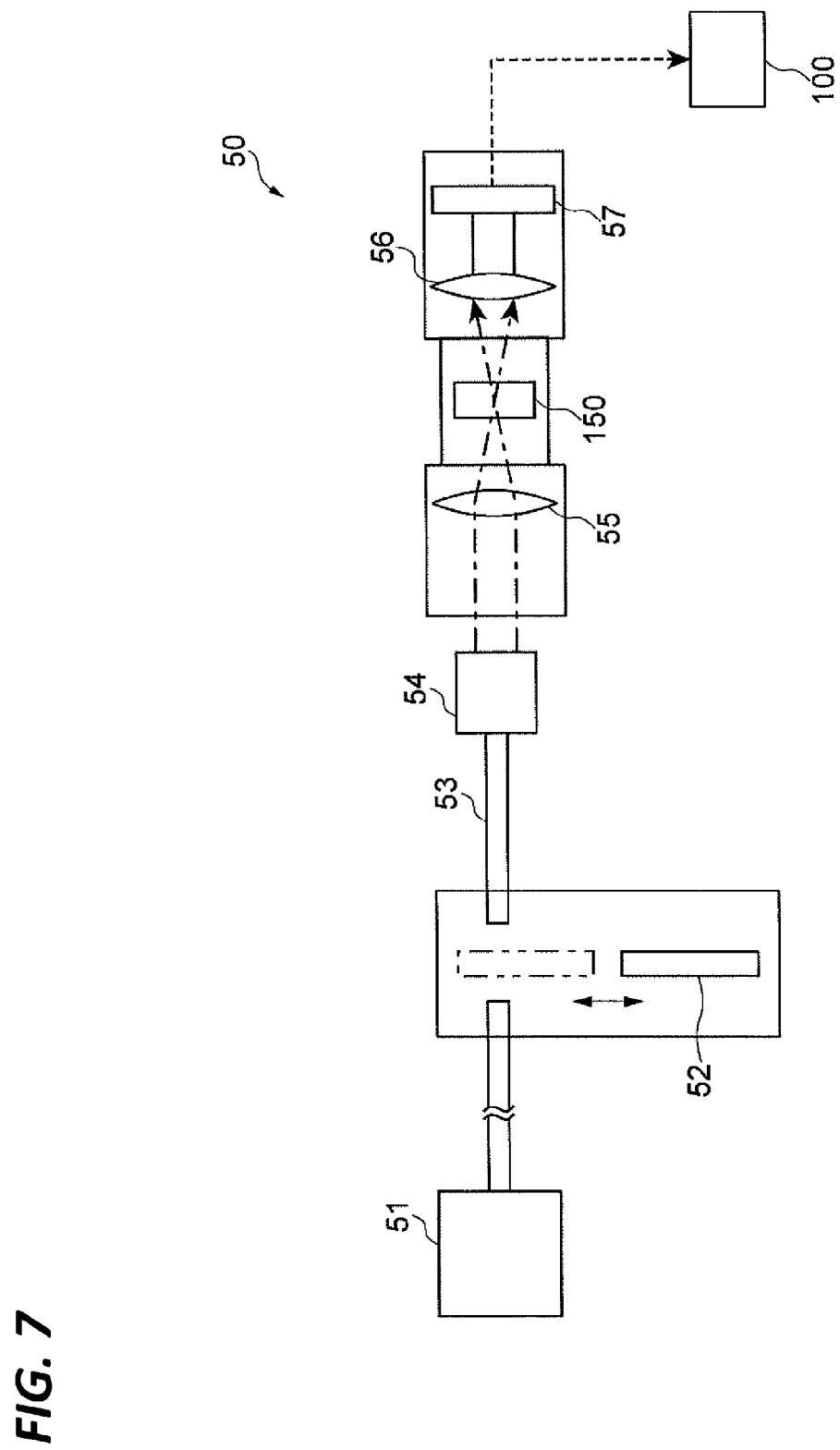
FIG. 7 is a schematic configuration diagram illustrating a first laser unit according to the present embodiment.

The second laser unit 60 has the same configuration as the first laser unit 50 illustrated in FIG. 7. That is, the second laser unit 60 has, in addition to the light source 61, a configuration including a shutter, a fiber, a collimator, an objective lens, a light receiving lens, and a light receiving element (all not illustrated). According to such a configuration, the electric signal output from the light receiving element to the controller 100 changes according to the degree of absorption of the laser light of the coating liquid flowing through the cuvette 160. Therefore, the color information of the coating liquid (e.g., information indicating whether the coating liquid has a color that readily absorbs the discrimination light) may be grasped according to the electric signal. As described above, since the laser light having a wavelength similar to the wavelength of the laser light irradiated from the first laser unit 50 to the coating liquid is used as the discrimination light, the phrase "the coating liquid . . . readily absorbs the discrimination light" has the same meaning as that of the phrase "the coating liquid . . . readily absorbs the laser light irradiated from the first laser unit 60 to the coating liquid." That is, it is possible to grasp whether the coating liquid readily absorbs the laser light irradiated from the first laser unit 50 to the coating liquid based on the electric signal output from the light receiving element of the second laser unit 60. The second laser unit 60 constitutes an irradiation propriety determination mechanism together with the controller 100 described below. That is, the second laser unit 60 and the controller 100 constitutes the irradiation propriety determination mechanism that determines whether the first laser unit 50 irradiates the coating liquid with the laser light, based on the coating liquid upstream of a position of the pipe (flow path) where the coating liquid is irradiated with laser light from the first laser unit 50 (specifically, the coating liquid flowing in the pipe D2).

The controller 100 is configured to determine whether the color information of the coating liquid is predetermined color information that readily absorbs the wavelength of the laser light irradiated by the first laser unit 50, determine whether to irradiate the coating liquid with the laser light based on the determination result, and output information indicating whether the irradiation is possible.

Further, when the coating liquid absorbs a certain amount or more of the laser light (discrimination light) irradiated to the coating liquid by the light source 61 of the second laser unit 60, the controller 100 determines that the color information of the coating liquid is predetermined color information that readily absorbs the wavelength of the laser light irradiated by the first laser unit 50.

Further, when it is determined that that the irradiation of the coating liquid with the laser light is impossible, the controller 100 may output, as information indicating whether the irradiation is possible, a warning indicating that the color of the coating liquid is abnormal, and information specifying the wafer W that is being processed.

When it is determined that the irradiation of the coating liquid with the laser light is impossible, the controller may be configured to further execute a shutoff control of shutting off an output of the laser light by the first laser unit 50, a load stop control of stopping a loading of a new substrate, a liquid feed stop control of stopping a liquid feeding of the processing liquid to the flow path, and a drainage control of discarding the processing liquid flowing through the flow path.

Figure 5:
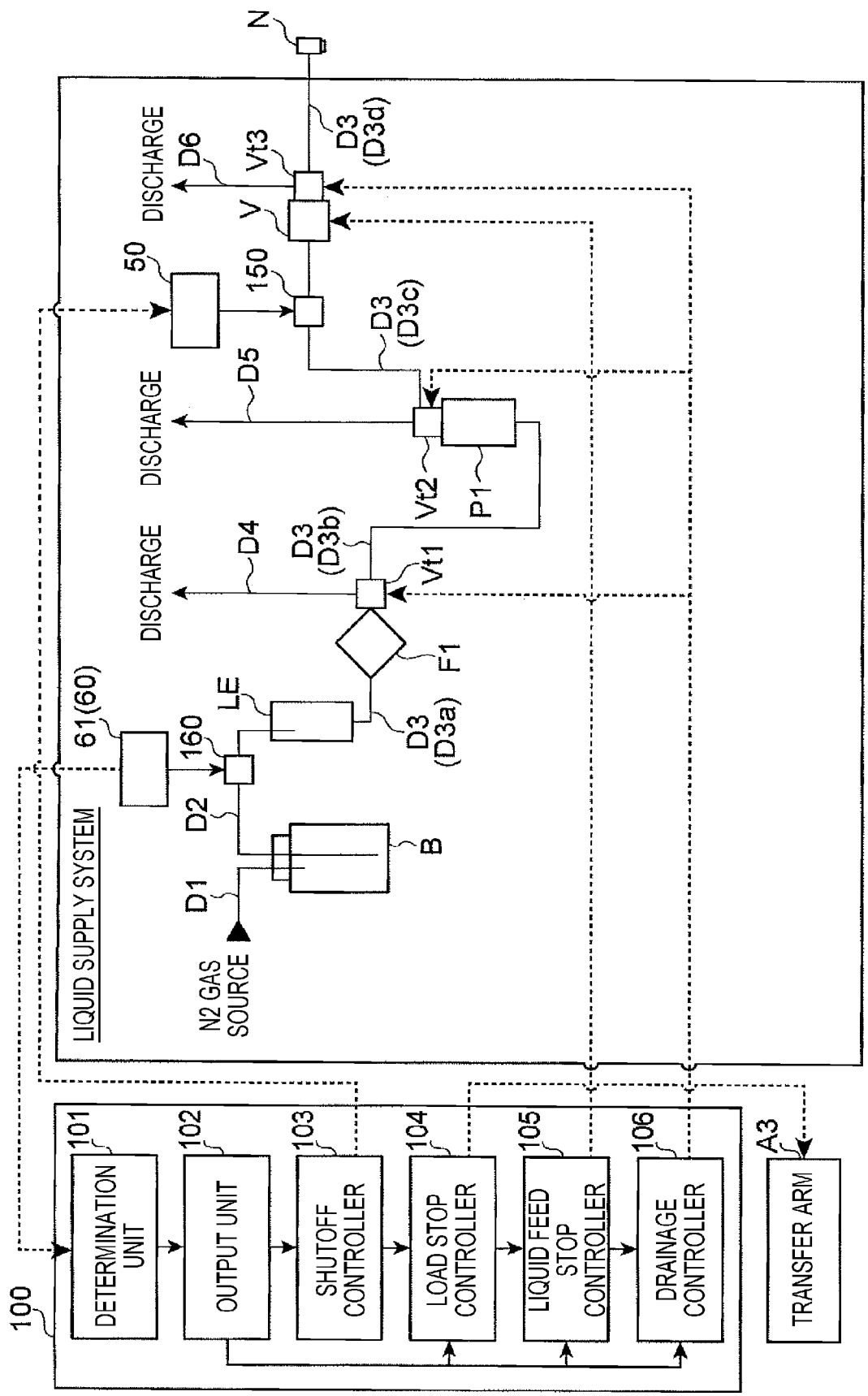
FIG. 5 is a view illustrating a liquid supply system according to the present embodiment.

As illustrated in FIG. 5, the controller 100 includes a determination unit 101, an output unit 102, a shutoff controller 103, a load stop controller 104, a liquid feed stop controller 105, and a drainage controller 106 as functional modules.

The determination unit 101 determines whether the color information of the coating liquid is predetermined color information that readily absorbs the wavelength of the laser light irradiated by the first laser unit 50. When the laser light (discrimination light) irradiated to the coating liquid by the light source 61 of the second laser unit 60 is absorbed in the coating liquid for a certain amount or more, the determination unit 101 determines that the color information of the coating liquid is predetermined color information that readily absorbs the wavelength of the laser light irradiated by the first laser unit 50. The determination unit 101 receives an electric signal from the light receiving element of the second laser unit 60. For example, the electric signal becomes smaller as the degree of absorption of the laser light in the coating liquid becomes larger, and becomes larger as the degree of absorption becomes smaller. Therefore, the determination unit 101 may specify the degree of absorption of the laser light in the coating liquid based on the electric signal transmitted from the light receiving element of the second laser unit 60. The determination unit 101 determines that the coating liquid whose absorption degree is larger than a predetermined value is a coating liquid having predetermined color information that readily absorbs the wavelength of the laser light irradiated by the first laser unit 50 (i.e., the coating liquid that is altered by the laser light of the first laser unit 50).

The output unit 102 determines whether the first laser unit 50 may irradiate the coating liquid with the laser light based on the determination result of the determination unit 101, and outputs information indicating whether the irradiation is possible. When it is determined in the determination result that the color information of the coating liquid is predetermined color information that readily absorbs the wavelength of the laser light irradiated by the first laser unit 50, the output unit 102 determines that irradiation is not possible, and determines that irradiation is possible when it is determined that the color information is not the predetermined color information. The output unit 102 outputs information indicating whether the irradiation is possible to the shutoff controller 103, the load stop controller 104, the liquid feed stop controller 105, and the drainage controller 106. The output unit 102 outputs, as information indicating whether the irradiation is possible, for example, a warning indicating that the color of the coating liquid is abnormal, and information specifying the wafer W that is being processed.

When the output unit 102 determines that the irradiation is not possible, the shutoff controller 103 executes a shutoff control of shutting off the laser light output from the first laser unit 50. Specifically, the shutoff controller 103 controls the actuator of the first laser unit 50 so that the shutter 52 of the first laser unit 50 moves to a position where the optical path of the fiber 53 is shielded.

When the output unit 102 determines that the irradiation is impossible, the load stop controller 104 executes a load stop control of stopping the loading of a new wafer W. Specifically, the load stop controller 104 controls the actuator of the transfer arm A3 (see, e.g., FIG. 3) so that the new wafer W is not loaded into the coating unit U1.

When the output unit 102 determines that the irradiation is impossible, the liquid feed stop controller 105 executes the liquid feed stop control of stopping the liquid feed of the coating liquid to the portion D3d of the pipe D3 that is a flow path toward the nozzle N. Specifically, the liquid feed stop controller 105 controls the plate of the valve V to be closed, thereby stopping the feeding of the coating liquid to the portion D3d of the pipe D3, and stopping the coating liquid from being discharged from the nozzle N.

When the output unit 102 determines that the irradiation is impossible, the drainage controller 106 executes a drainage control of discarding the coating liquid flowing through the pipe D3. Specifically, the drainage controller 106 operates the three-way valve Vt1 so that the coating liquid from the filter device F1 is discarded from the pipe D4 between the filter device F1 and the pipe D4. Further, the drainage controller 106 operates the three-way valve Vt2 so that the coating liquid from the pump device P1 is discarded from the pipe D5 between the pump device P1 and the pipe D5. In addition, the drainage controller 106 operates the three-way valve Vt3 so that the coating liquid from the valve V is discarded from the pipe D6 between the valve V and the pipe D6.

Figure 8:
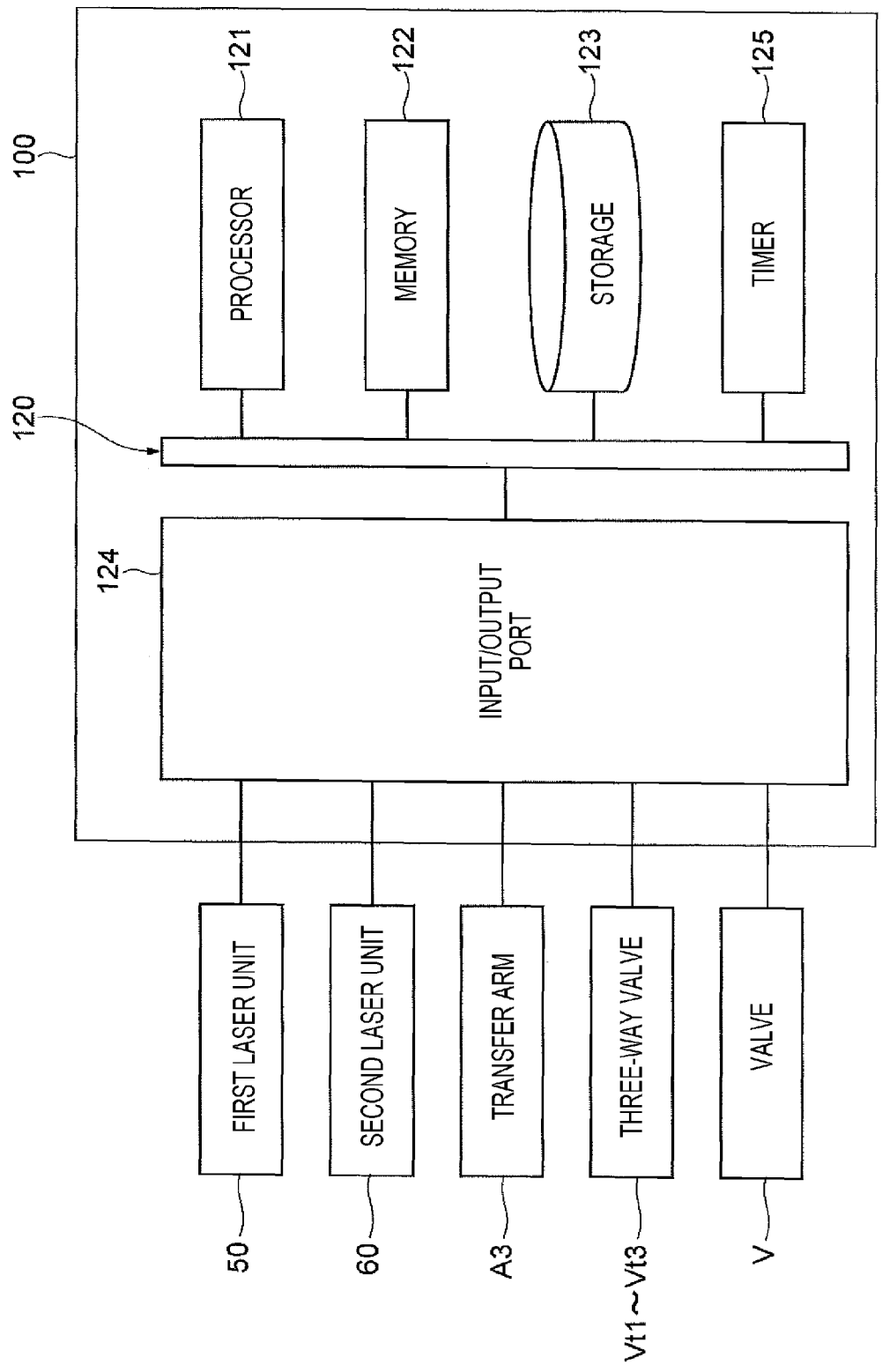
FIG. 8 is a hardware configuration diagram of a controller.

The controller 100 is composed of one or more control computers. For example, the controller 100 has the circuit 120 illustrated in FIG. 8. The circuit 120 includes one or more processors 121, a memory 122, a storage 123, an input/output port 124, and a timer 125.

The input/output port 124 inputs/outputs electric signals to/from the first laser unit 50, the second laser unit 60, the transfer arm A3, the three-way valves Vt1 to Vt3, and the valve V. The timer 125 measures elapsed time by counting, for example, a reference pulse having a constant cycle. The storage 123 has a computer-readable recording medium such as a hard disk. The recording medium records a program for executing a substrate processing procedure (to be described later). The recording medium may be a removable medium such as a non-volatile semiconductor memory, a magnetic disk, or an optical disk. The memory 122 temporarily records the program loaded from the recording medium of the storage 123 and the calculation result by the processor 121. The processor 121 configures each functional module described above by executing the above program in cooperation with the memory 122.

The hardware configuration of the controller 100 is not necessarily limited to one that configures each functional module by a program. For example, each functional module of the controller 100 may be configured by a dedicated logic circuit or an application specific integrated circuit (ASIC) in which the logic circuit is integrated.

(Substrate Processing Procedure)

Figure 9:
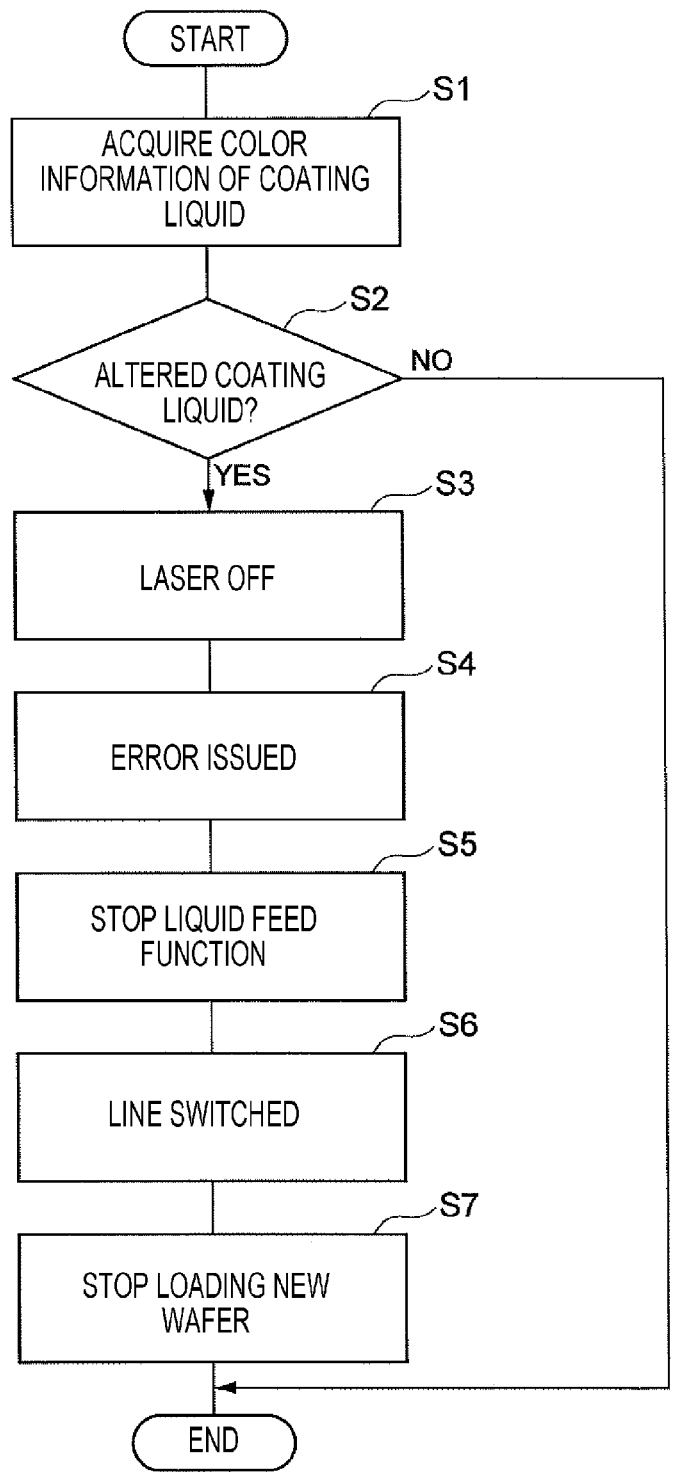
FIG. 9 is a flowchart of a substrate processing procedure.

Next, as an example of the substrate processing method, descriptions will be made on a substrate processing procedure including determination of the color information of the coating liquid described above. As illustrated in FIG. 9, the controller 100 sequentially executes steps S1, S2, S3, S4, S5, S6, and S7.

In step S1, the determination unit 101 acquires the color information of the coating liquid from the second laser unit 60. The color information of the coating liquid is information specified by the second laser unit 60 based on the degree of absorption of the discrimination light in the coating liquid, and information indicating whether the coating liquid has a color that readily absorbs the discrimination light (and the laser light irradiated from the first laser unit 50).

In step S2, the determination unit 101 determines, based on the acquired color information of the coating liquid, whether the coating liquid is a coating liquid that is altered by the laser light irradiated from the first laser unit 50. That is, the determination unit 101 determines whether the color information of the coating liquid is predetermined color information that readily absorbs the wavelength of the laser light irradiated by the first laser unit 50. When it is determined in step S2 that the coating liquid is a coating liquid that is not altered by the laser light irradiated from the first laser unit 50, it is determined that the laser light may be irradiated from the first laser unit 50, and the process ends. Meanwhile, when it is determined in step S2 that the coating liquid is a coating liquid that is altered by the laser light irradiated from the first laser unit 50, it is determined that the laser light may not be irradiated from the first laser unit 50, and information indicating that irradiation is not possible is output. Then, steps S3 to S7 are sequentially executed.

In step S3, the shutoff controller 103 executes a shutoff control so that the output of the laser light from the first laser unit 50 is shut off (laser is turned OFF). Specifically, the shutoff controller 103 controls the actuator of the first laser unit 50 so that the shutter 52 of the first laser unit 50 moves to a position where the optical path of the fiber 53 is shielded.

In step S4, the output unit 102 outputs error information (error notification). Specifically, the output unit 102 informs that there is a suspicion that the coating liquid is a different type of chemical liquid according to the color information of the coating liquid (the degree of absorption of laser light), and a normal measurement by the first laser unit 50 (main laser) is impossible. Further, when the output of the laser light from the first laser unit 50 has not been shut off (when the laser is turned ON), the output unit 102 notifies that the coating liquid may be altered.

In step S5, the liquid feed stop controller 105 executes a liquid feed stop control of stopping the liquid feed function. Specifically, the liquid feed stop controller 105 controls the plate of the valve V to be closed, thereby stopping the feeding of the coating liquid to the portion D3$d$ of the pipe D3, and stopping the coating liquid from being discharged from the nozzle N.

In step S6, the drainage controller 106 performs a line switching to switch the flow path and executes a drainage control of discarding the coating liquid flowing through the pipe D3. Specifically, the drainage controller 106 operates the three-way valve Vt1 so that the coating liquid from the filter device F1 that allows the coating liquid to flow between the filter device F1 and the pipe D4 is discarded from the pipe D4. Further, the drainage controller 106 operates the three-way valve Vt2 so that the coating liquid from the pump device P1 is discarded from the pipe D5 between the pump device P1 and the pipe D5. In addition, the drainage controller 106 operates the three-way valve Vt3 so that the coating liquid from the valve V is discarded from the pipe D6 between the valve V and the pipe D6.

In step S7, the load stop controller 104 executes the load stop control so that the loading of a new wafer W is stopped. Specifically, the load stop controller 104 controls the actuator of the transfer arm A3 (see, e.g., FIG. 3) so that the new wafer W is not loaded into the coating unit U1.

Further, the above steps S3 to S7 do not necessarily have to be all executed or need not be executed in the order described above. For example, when the irradiation of the laser light to the coating liquid (irradiation of the laser light from the first laser unit 50) may be avoided only by controlling the valve V, the shutoff control in step S3 needs not be performed. In addition, when the shutoff control of step S3 is executed, the liquid feed stop control of step S5 does not necessarily have to be executed. Further, after step S4, the drainage control of step S6 does not necessarily have to be performed.

[Effect of Present Embodiment]

The coating/developing device 2 according to the present embodiment includes: a first laser unit 50 that irradiates a coating liquid of a wafer W flowing through a pipe D3 with laser light and acquires a state of the coating liquid based on a change in the laser light; and an irradiation propriety determination mechanism that determines whether the first laser unit 50 irradiates the coating liquid with the laser light based on the coating liquid on a liquid bottle side B of a position where the laser light is irradiated from the first laser unit 50 in a flow path (specifically, the coating liquid flowing through a pipe D2). The irradiation propriety determination mechanism includes: a second laser unit 60 that acquires color information of the coating liquid; and a controller 100. The controller 100 is configured to execute determining whether the color information of the coating liquid is predetermined color information that readily absorbs a wavelength of the light irradiated by the first laser unit 50, determining whether the irradiation of the coating liquid with the laser light is possible based on the determination result, and outputting information indicating whether the irradiation is possible.

In such a coating/developing device 2, it is determined whether the color information of the coating liquid is predetermined color information that readily absorbs the wavelength of the irradiated light, based on the coating liquid on an upstream side of the position where the laser light is irradiated to the coating liquid by the first laser unit 50, and whether the irradiation of the coating liquid with the laser light is possible based on the determination result. Depending on the combination of the color of the coating liquid and the wavelength band of the laser light to be irradiated, the coating liquid may be altered due to the absorption of light. In this regard, it is possible to determine whether the coating liquid is altered by the irradiated laser light by determining whether the color information of the coating liquid is predetermined color information that readily absorbs the wavelength of the laser light in the stage before irradiating the coating liquid with the laser light. Then, whether the irradiation of laser light to the coating liquid is possible is determined based on the determination result and information indicating the irradiation possibility is output, so that, for example, the coating liquid flowing through the flow path may be altered by the laser light from the first laser unit 50. In such a case, it becomes possible to take measures such as stopping the irradiation of the laser light from the first laser unit 50, which may cause the coating liquid to be altered.

The second laser unit 60 has a light source 61 that irradiates the coating liquid with laser light (discrimination light) having a wavelength that is similar to the wavelength of the laser light that is radiated from the first laser unit 50 to the coating liquid. When the discrimination light irradiated to the coating liquid by the light source 61 is absorbed in the coating liquid for a certain amount or more, the controller 100 determines that the color information of the coating liquid is predetermined color information that readily absorbs the wavelength of the laser light irradiated by the first laser unit 50. When the discrimination light is absorbed in the coating liquid for a certain amount or more, it is considered that the coating liquid also readily absorbs the light, which has a wavelength similar to that of the discrimination light and is irradiated to the coating liquid from the first laser unit 50. Therefore, when the discrimination light is absorbed in the coating liquid for a certain amount or more, it is possible to readily and accurately determine the above-mentioned irradiation possibility by determining that the color information of the coating liquid is predetermined color information that readily absorbs the wavelength of the laser light irradiated by the first laser unit 50, and that the irradiation of the laser light to the coating liquid is impossible.

The light source 61 of the second laser unit 60 irradiates laser light having a wavelength longer than that of the laser light irradiated from the first laser unit 50 to the coating liquid, as the discrimination light. By making the discrimination light long-wavelength laser light, that is, laser light having low energy, it is possible to suppress the alteration of the coating liquid in the step of irradiating the discrimination light (determination step).

The light source 61 of the second laser unit 60 irradiates the coating liquid with a determination light whose irradiation intensity is lower than the laser light irradiated from the first laser unit 50 to the coating liquid. As a result, it is possible to suppress the coating liquid from being altered in the step of irradiating the discrimination light (determination step).

Further, when it is determined that that the irradiation of the coating liquid with the laser light is impossible, the controller 100 may output, as information indicating whether the irradiation is possible, a warning indicating that the color of the coating liquid is abnormal, and information specifying the wafer W that is being processed. Thus, it is possible to appropriately execute the process of preventing the alteration of the coating liquid based on the information indicating whether the irradiation is possible.

When it is determined that the irradiation of laser light to the coating liquid is impossible, the controller 100 is configured to further execute at least one of a shutoff control of shutting off an output of the laser light by the first laser unit 50, a load stop control of stopping a loading of a new substrate W, a liquid feed stop control of stopping a liquid feeding of the coating liquid to the flow path, and a drainage control of discarding the coating liquid flowing through the flow path. Thus, it is possible to appropriately prevent alteration of the coating liquid and influence of alteration of the coating liquid from affecting the wafer W. That is, since the coating liquid is not irradiated with the laser light by performing the shutoff control, the alteration of the coating liquid may be prevented. Further, the load stop control is performed, so that the altered coating liquid may be prevented from being applied to the wafer W. In addition, it is possible to prevent the liquid feed of the processing liquid that may be altered by the irradiation of laser light by performing the liquid feed stop control. Further, it is possible to appropriately discard the processing liquid that may be altered by performing the drainage control, and it is possible to prevent the downstream side of the flow path from being contaminated with the different coating liquid.

Figure 10:
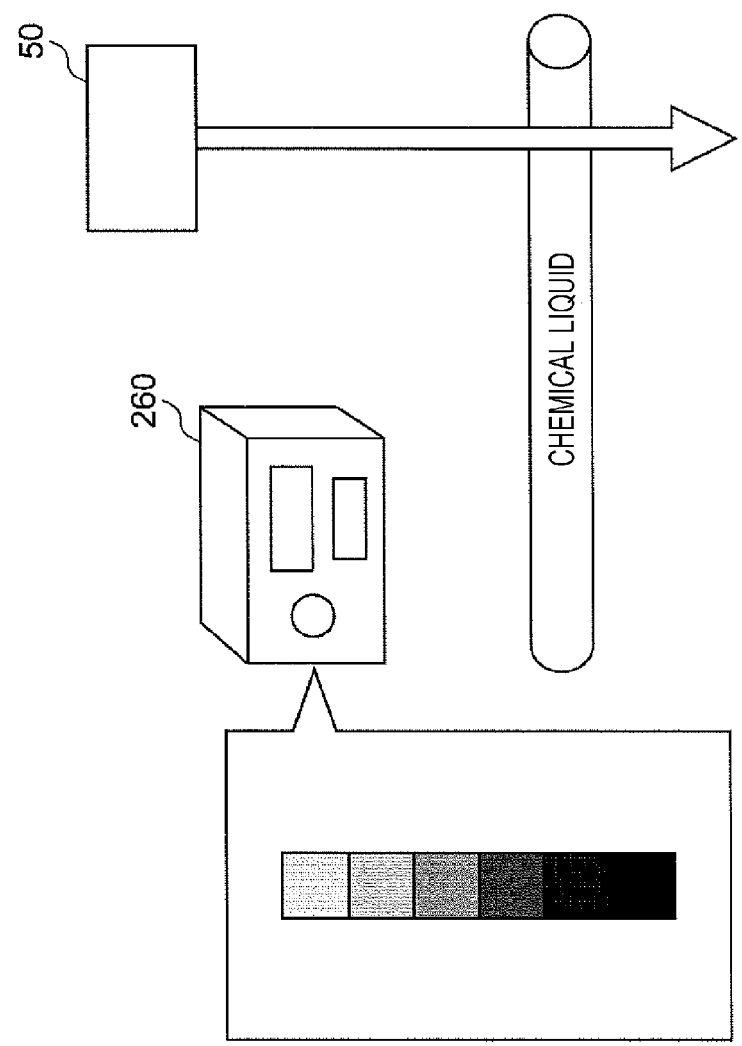
FIG. 10 is a view schematically illustrating a configuration for preventing alteration of the coating liquid according to a modification.

Although the embodiments of the present disclosure have been described above, the present disclosure is not limited to the above embodiments. For example, although it has been described that the second laser unit 60 is used as the color information acquisition mechanism, the present disclosure is not limited thereto. As illustrated in FIG. 10, a colorimeter 260 may be used as the color information acquisition mechanism. The colorimeter 260 uniquely specifies, for example, the color of the coating liquid from 256 colors. When the colorimeter 260 is used as the color information acquisition mechanism, for example, NG color (a color that readily absorbs the laser light from the first laser unit 50) is set in advance. When the color of the coating liquid specified by the colorimeter 260 is the NG color, the irradiation of the laser light from the first laser unit 50 may be stopped. Further, as the color information acquisition mechanism, an imaging device may be used instead of the colorimeter 260. In this way, the color information of the coating liquid may be appropriately grasped with a simple configuration by acquiring the color information of the coating liquid by the colorimeter or the imaging device.

Further, the light source 61 (irradiation unit) of the second laser unit 60 as the color information acquisition mechanism may irradiate the coating liquid with laser light (discrimination light) having a plurality of patterns of wavelengths.

The light source 61 of the second laser unit 60 may irradiate one place with a plurality of laser lights while changing the wavelength, or may be provided at a plurality of places and irradiate laser lights having different wavelengths at each place. In this way, by irradiating the coating liquid with laser light having a plurality of patterns of wavelengths, it is possible to more finely specify the wavelength band in which the coating liquid is readily absorbed. As a result, it is possible to improve the accuracy of the determination as to whether to stop the irradiation of the laser light from the first laser unit 50 and the content of the error information issued.

DESCRIPTION OF SYMBOLS

2: coating/developing device (substrate processing apparatus)
50: first laser unit (optical measurement mechanism)
60: second laser unit (color information acquisition mechanism)
61: light source (irradiation unit)
100: controller
260: colorimeter (color information acquisition mechanism)
B: liquid bottle (supply source of processing liquid)
D1 to D6: pipe (flow path)
W: wafer

What is claimed is:

1. A substrate processing apparatus comprising:
a first laser and light receiving element including a first lens configured to irradiate a first light to a processing liquid flowing through a flow path supplied from a supply source, receive light irradiated to a portion of the flow path, and output a first signal;
a second laser and light receiving element including a second lens configured to irradiate a second light to an upstream portion than the portion of the flow path, receive light irradiated to the upstream portion, and output a second signal; and
a controller configured to control the first laser and light receiving element and the second laser and light receiving element,
wherein the controller is programmed to:
determine whether color information of the processing liquid flowing through the upstream portion matches predetermined color information that readily absorbs the first light, based on the second signal,
determine whether to irradiate the first light to the processing liquid by the first laser and light receiving element, based on a determination result by the second signal of whether the color information of the processing liquid matches the predetermined color information, and
when determined that the color information of the processing liquid does not match the predetermined color information, irradiate the first light to the processing liquid by the first laser and light receiving element and obtain status of the processing liquid based on the first signal output from the first laser and light receiving element.

2. The substrate processing apparatus according to claim 1, wherein respective portions of the flow path to which the first and second lights are irradiated are formed by cuvettes made of material through which the first and second lights are capable of being transmitted.

3. The substrate processing apparatus according to claim 1, wherein an energy of the second light is lower than an energy of the first light.

4. The substrate processing apparatus according to claim 1, wherein the controller determines that the color information of the processing liquid matches the predetermined color information when the second light is absorbed in the processing liquid by a predetermined amount or more.

5. A substrate processing method comprising:
outputting a first signal by irradiating a first light to a processing liquid flowing through a flow path supplied from a supply source and receiving light irradiated to a portion of the flow path;
outputting a second signal by irradiating a second light to an upstream portion than the portion of the flow path and receiving light irradiated to the upstream portion; and
first determining whether color information of the processing liquid flowing through the upstream portion matches predetermined color information that readily absorbs the first light, based on the second signal,
second determining whether to irradiate the first light to the processing liquid by the first laser and light receiving element, based on a determination result by the second signal of whether the color information of the processing liquid matches the predetermined color information, and
when determined that the color information of the processing liquid does not match the predetermined color information at the first determining, irradiating the first light to the portion of the flow path, and obtaining status of the processing liquid based on the first signal.

6. The substrate processing method according to claim 5, wherein an energy of the second light is lower than an energy of the first light.

7. The substrate processing method according to claim 5, further comprising:
determining that the color information of the processing liquid matches the predetermined color information when the second light is absorbed in the processing liquid by a predetermined amount or more.

* * * * *